United States Patent [19]

Ogawa

[11] 4,255,272
[45] Mar. 10, 1981

[54] METHOD FOR PRODUCING PIEZOELECTRIC CERAMICS

[75] Inventor: Toshio Ogawa, Nagaokakyo, Japan

[73] Assignee: Murata Manufacturing Co., Ltd., Kyoto, Japan

[21] Appl. No.: 67,420

[22] Filed: Aug. 17, 1979

[30] Foreign Application Priority Data

Aug. 17, 1978 [JP] Japan .................. 53-101212

[51] Int. Cl.³ .................. C04B 35/46; C04B 35/48; C04B 35/64
[52] U.S. Cl. .................. 252/62.9; 264/65; 106/73.3
[58] Field of Search .................. 252/62.9; 264/65; 106/73.3

[56] References Cited

U.S. PATENT DOCUMENTS

| | | |
|---|---|---|
| 3,179,594 | 4/1965 | Kulcsar et al. .................. 252/62.9 |
| 3,856,693 | 12/1974 | Kim .................. 252/62.9 |
| 3,970,572 | 7/1976 | Ogawa et al. .................. 252/62.9 |

FOREIGN PATENT DOCUMENTS

| | | |
|---|---|---|
| 51-42995 | 4/1976 | Japan .................. 252/62.9 |
| 51-42997 | 4/1976 | Japan .................. 252/62.9 |

Primary Examiner—Jack Cooper

Attorney, Agent, or Firm—Birch, Stewart, Kolasch & Birch

[57] ABSTRACT

A method for producing piezoelectric ceramics of a $Pb(Sn_\alpha Sb_{1-\alpha})O_3$–$PbTiO_3$–$PbZrO_3$ system is disclosed which comprises providing a piezoelectric ceramic composition expressed by the general formula:

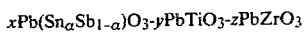

$xPb(Sn_\alpha Sb_{1-\alpha})O_3$-$yPbTiO_3$-$zPbZrO_3$ wherein subscripts $\alpha$, x and y are mole fractions of the respective components and have the following values, $x+y+z=1.00$, $\frac{1}{4} \leq \alpha \leq \frac{3}{4}$, said composition falling within a polygonal area defined by points A, B, C, D and E in FIG. 3, forming powder of the composition into forming bodies, and firing the forming bodies in an oxygen atmosphere containing not less than 80 vol % of oxygen. The firing in the oxygen atmosphere is effected at a temperature not less than 1000° C. A part of lead in the composition may be replaced with not more than 20 atomic percent of at least one metal selected from the group consisting of Ba, Ca, Sr and Cd. The composition may contain a small amount of Mn, Mg and/or Cr. Fine dense ceramics with low porosity, small average size and fine grain size are produced which can be applied to various electronic parts.

13 Claims, 28 Drawing Figures

5 μ

5 μ

5 μ

10μ

50μ

10 μ

50 μ

10 μ

2 μ

10 μ

2 μ

10 μ

2 μ

10 μ

2 μ

METHOD FOR PRODUCING PIEZOELECTRIC CERAMICS

BACKGROUND OF THE INVENTION

The present invention relates to a method for producing piezoelectric ceramics and, more particularly, to a method for producing piezoelectric ceramics of a system $Pb(Sn_\alpha Sb_{1-\alpha})O_3\text{-}PbTiO_3\text{-}PbZrO_3$ with $\alpha$ ranging from $\frac{1}{4}$ to $\frac{3}{4}$.

There are piezoelectric ceramics of a barium titanate system ($BaTiO_3$), or lead zirconate titanate ($Pb(Zr,Ti)O_3$) system, or lead titanate ($PbTiO_3$) system which are now being manufactured and used in the electronic fields as electronic parts such as acoustic surface wave elements including acoustic surface wave filters, acoustic surface wave delay lines and acoustic surface wave discriminators; ceramic filters; ceramic resonators; ceramic vibrators; piezoelectric ignition elements; or piezoelectric ceramic transformers.

Such piezoelectric ceramics have generally been manufactured in the following processes: Weighing—Wet-Mixing—Drying—Calcination—Wet-Crushing (with binder)—Drying—Granulation—Forming—Firing. The most important process affecting the quality of the final products is firing which is effected in air. In order to prevent the evaporation of lead oxide from the composition during firing, it is the usual practice to fire forming bodies in a closed saggar made of a material which is unreactive to PbO and has no permeability of PbO, such as alumina or magnesia. In addition, PbO powder or mixed powder of PbO and $ZrO_2$ is put in the sagger to form a lead oxide atmosphere surrounding the forming bodies.

However, the piezoelectric ceramics produced by the above normal air sintering method have relatively high porosity, large average pore size ranging from 5 to 15 microns. Because of their relatively high porosity and large average pore size, their regular use is impossible for some specific applications. For example, when a ceramic material is applied to acoustic surface wave filters having a general construction of FIG. 1 and comprising a piezoelectric ceramic substrate 1 and interdigital electrodes 2 and 3 formed thereon, the porosity and pore size must be small as much as possible since the width a of the electrodes decreases with the increase of operating frequencies of the filters. Assuming that the acoustic surface wave velocity is 2400 m/sec, a filter designed to be operated at a frequency of 58 MHz is required to have interdigital electrodes with a width a of about 10 microns since the wave length is about 41 microns. When split electrodes 4 shown in FIG. 1 are used to restrain the Triple transit Echo (Ref: PROPERTIES OF SPLIT-CONNECTED AND SPLIT-ISOLATED MULTISTRIP COUPLER, A. J. Devris et al. "1975 Ultrasonics Symposium Proceedings" IEEE cat. #75 CHO 994-4SU), they are required to have a width 4a of about 5 microns. Accordingly, if the piezoelectric ceramics used have high porosity, or if the pores connected to the surface of the ceramics are larger than 2 microns, the pores would cause the disconnection of the electrodes, in particular the split electrodes 4, thus making it difficult to produce acoustic surface wave filters for very high frequency applications.

When the piezoelectric ceramics with high porosity are applied to ceramic vibrators, ceramic filters, and the like, it is impossible to obtain the products with high quality because of the low strength of the ceramics. In the vibrators, it is the usual practice to apply a high voltage to obtain large amplitudes of the vibration. In this case, if the ceramics have a strain strength lower than the strain stress which occurs due to the vibration of the ceramics, it results in the breakdown of the ceramics.

In addition, in preparing miniaturized, ladder type filters which comprises a pair of resonators (a) and (b) as shown in FIG. 2, it is the usual practice to reduce the thickness of ceramic bodies for the 1st or 2nd resonator (a) or (b) to make the capacitance ratio between them large. Since, in the ladder type filters, there is a regular relation between the thickness and the mechanical strength of the ceramics, the ceramics with low strength make it difficult to keep the highest quality level of the product. In the resonators for high temperature applications, designed to be operated at temperatures ranging from 100° to 200° C., it is necessary to use ceramics with high thermal shock resistance in addition to the high strength. In this case, the pores present in the ceramics lead to serious problems. In the thickness expansion mode filters, its center frequency is inverse to the thickness of the ceramics so that the strength of ceramics has great influence on the quality of the product used in high frequencies. The most critical factors affecting on the strain strength and thermal shock resistance are the grain size and porosity, so that it is necessary to use ceramic materials with fine grain size and low porosity.

As a method for the fabrication of piezoelectric ceramics with low porosity, there have been proposed a hotpressing method and a hot-isostatic pressing method. However, both the methods have not been developed for mass-production, resulting in the considerable rise of manufacturing cost.

In addition to the above processes, there is a few specific processes using oxygen atmosphere sintering technique. For example, Gray S. Snow reported high-lead-oxide atmosphere sintering technique for producing transparent electrooptic lanthanum modified lead zirconate titanate ceramics, which is disclosed in "Fabrication of Transparent Electrooptic PLZT Ceramics by Atmosphere Sintering" (Journal of The American Ceramic Society, 56 (2) 91–96 (1973)). In this process, forming bodies of chemically prepared PLZT powder with excess PbO are sintered in an atmosphere containing oxygen and a very high partial pressure of lead oxide. The excess PbO is present as a liquid phase at the grain boundaries of the forming bodies at the sintering temperature, and this liquid phase enhances densification and pore removal by promoting mass transport along the grain boundaries to the pores. Although this process makes it possible to produce PLZT ceramics with low porosity, it has a serious disadvantage such that very large pores remain in the sintered ceramics because of the coalescence of small pores into large ones.

As described above, various attempts have been made to produce lead-containing piezoelectric ceramics with low porosity together with small grain size, but fully satisfactory results are not yet obtained.

SUMMARY OF THE INVENTION

It is therefore an object of the present invention to provide a method for producing piezoelectric ceramics for general applications which fully satisfy the aforesaid requirements.

Another object of the present invention is to provide a method for producing piezoelectric ceramics of a $Pb(Sn_\alpha Sb_{1-\alpha})O_3\text{-}PbTiO_3\text{-}PbZrO_3$ system with very low porosity, small average pore size and fine grain size.

Still another object of the present invention is to provide piezoelectric ceramics of a $Pb(Sn_\alpha Sb_{1-\alpha})O_3\text{-}PbTiO_3\text{-}PbZrO_3$ system which make it possible to produce various electronic parts with high quality.

According to the present invention, there is provided a method for producing piezoelectric ceramics of a system $Pb(Sn_\alpha Sb_{1-\alpha})O_3\text{-}PbTiO_3\text{-}PbZrO_3$, which comprises (a) providing a piezoelectric ceramic composition expressed by the general formula:

$$xPb(Sn_\alpha Sb_{1-\alpha})O_3\text{-}yPbTiO_3\text{-}zPbZrO_3$$

wherein subscripts $\alpha$, x, y and z are mole fractions of the respective components and wherein $x+y+z=1.00$, $\frac{1}{4} \leq \alpha \leq \frac{3}{4}$, said composition falling within a polygonal compositional area defined by the points A, B, C, D and E in FIG. 3 (except the compositional area defined by a line connecting the points A and E), the sets of mole fractions of the three components at said points being as follows:

|   | x    | y    | z    |
|---|------|------|------|
| A | 0.01 | 0.99 | 0.00 |
| B | 0.01 | 0.04 | 0.95 |
| C | 0.04 | 0.01 | 0.95 |
| D | 0.40 | 0.01 | 0.59 |
| E | 0.40 | 0.60 | 0.00 |

(b) forming powder of said composition into forming bodies, and (c) firing said forming bodies in an oxygen atmosphere containing not less than 80 vol% oxygen.

When piezoelectric ceramics of the above system are applied to vibrators, particularly, vibrators for high temperature applications, it is preferred to use a composition falling within a polygonal area included in the polygonal area ABCDE and defined by the points A, F, G and H in FIG. 3 (except the compositional area defined by a line connecting the points A and H), the sets of mole fractions of the three components at said points being as follows:

|   | x    | y    | z    |
|---|------|------|------|
| A | 0.01 | 0.99 | 0.00 |
| F | 0.01 | 0.40 | 0.59 |
| G | 0.25 | 0.50 | 0.25 |
| H | 0.35 | 0.65 | 0.00 |

When piezoelectric ceramics are applied to elements required to have high electromechanical coupling coefficient, it is preferred to use a composition falling within the polygonal area included in the above polygonal area ABCDE and defined by the points I, J, K, L, G and M, the sets of mole fractions of the three components at said points being as follows:

|   | x    | y    | z    |
|---|------|------|------|
| I | 0.01 | 0.60 | 0.39 |
| J | 0.01 | 0.30 | 0.69 |
| K | 0.15 | 0.25 | 0.60 |
| L | 0.25 | 0.25 | 0.60 |
| G | 0.25 | 0.50 | 0.25 |

-continued

|   | x    | y    | z    |
|---|------|------|------|
| M | 0.15 | 0.60 | 0.25 |

The compositions falling within this area defined by the points I, J, K, L, G and M exhibit high electromechanical coupling coefficient not less than 20%, and are suited for high coupling elements.

When piezoelectric ceramics of the above system are applied to acoustic surface wave elements, it is preferred to use a composition falling within the polygonal area included in the above polygonal area ABCDE and defined by the points N, B, C, O, L and P, the sets of mole fractions of the three components at said points being as follows:

|   | x    | y    | z    |
|---|------|------|------|
| N | 0.01 | 0.44 | 0.55 |
| B | 0.01 | 0.04 | 0.95 |
| C | 0.04 | 0.01 | 0.95 |
| O | 0.25 | 0.01 | 0.74 |
| L | 0.25 | 0.25 | 0.50 |
| P | 0.15 | 0.35 | 0.50 |

The piezoelectric ceramics having the above composition exhibit low dielectric constant (high impedance) and electromechanical coupling coefficient of acoustic surface waves ($K_{SAW}$) not less than 8%.

Preferably, the oxygen atmosphere is kept at a temperature not less than 1000° C., and the highest temperature at the final stage of the firing ranges from 1100° to 1350° C.

In order to obtain fewer pores and higher strength, it is preferred to use an oxygen atmosphere containing not less than 95 vol% of oxygen.

The above comaposition may further contain manganese, magnesium and/or chromium in oxide forms as one or more assistant components. The content of these elements may be not more than 5 wt% when converted into $MnO_2$, MgO and $Cr_2O_3$, respectively. Further, a part of lead in the composition may be replaced with not more than 20 atomic % of at least one element selected from the group consisting of Ba, Ca, Sr and Cd.

DETAILED DESCRIPTION OF THE INVENTION

According to the present invention, piezoelectric ceramics of a system $Pb(Sn_\alpha Sb_{1-\alpha})O_3\text{-}PbTiO_3\text{-}PbZrO_3$ with $\alpha$ ranging from $\frac{1}{4}$ to $\frac{3}{4}$ are produced in the following manner.

Raw materials are weighed according to the formula $xPb(Sn_\alpha Sb_{1-\alpha\pi})O_3\text{-}yPbTiO_3\text{-}zPbZrO_3$ with $\alpha$ ranging from $\frac{1}{4}$ to $\frac{3}{4}$. If necessary, one or more assistant components (i.e., Mn, Mg, Cr) may be incorporated into the resulting mixture. These raw materials may be oxides, carbonates, hydroxides, oxalates and so on and so forth. The raw material mixture is wet-mixed in a ball mill for at least 10 hours. After drying, the resulting mixture is calcined at a temperature of 600° to 900° C. for a few hours. During calcination, the decomosition of carbonate, hydroxide, oxalates and so on occurs to produce oxides. The resultant calcined body is wet-ground together with a suitable organic binder. The resulting slurry is dried, granulated, and then formed into forming bodies such as discs, plates and the like at a pressure of 700 to 1000 $Kg/cm^2$. The forming bodies are fired at the highest temperature of 1100° to 1350° C. in an oxygen atmosphere containing not less than 80 vol% oxygen.

In the ceramics of the system $Pb(Sn_\alpha Sb_{1-\alpha})O_3$-$PbTiO_3$-$PbZrO_3$ with $\alpha$ ranging from $\frac{1}{4}$ to $\frac{3}{4}$, there is the formation of an intermediate phase which has a pyrochlore crystal structure with oxygen defect, expressed by the formula $Pb_2Sn_{2\alpha}Sb_{2-2\alpha}O_{7-\alpha}$, at the grain boundaries of the forming bodies in the early stages of firing, in addition to the formation of a perovskite phase of $Pb(Ti,Zr)O_3$. This pyrochlore phase is present up to an elevated temperature of about 1200° C. at which the formation of the final product occurs, and it affects the microstructure of ceramics and the properties thereof. As will be understood from the descriptions with reference to FIGS. 8 to 11, the progress of sintering is assured by the diffusion of oxygen in the closed pores through the oxygen defect in the $Pb_2Sn_{2\alpha}Sb_{2-2\alpha}O_{7-\alpha}$ phase. The oxygen defect of the pyrochlore phase promotes the transfer of oxygen ions at the grain boundaries, thus making it possible to producing fine, dense ceramics. At the final stage of firing, the pyrochlore phase ($Pb_2Sn_{2\alpha}Sb_{2-2\alpha}O_{7-\alpha}$) transformes into a perovskite phase, $Pb(Sn_\alpha Sb_{1-\alpha})O_3$.

In order to obtain ceramics with very low porosity and fine grain size not more than 10 microns, the forming bodies are preferably made using fine-grained materials with average grain size of not more than 4 microns, and fired at a temperature of not less than 1000° C.

In the firing atmosphere with high oxygen concentration more than 80 vol% which is not less than 4 times that in air, the mobility of oxygen ions through the oxygen defect of the pyrochlore phase increase abruptly, without evaporation of lead oxide from the composition and occurence of liquid phase sintering reactions, resulting in the formation of a dense ceramic with the considerably decreased number of small pores.

If an oxygen atmosphere containing not less than 95 vol% of oxygen is used, it enables to obtain fewer pores and higher mechanical strength. The firing may be scheduled in two ways, one of which is that the high oxygen concentration atmosphere firing is initiated just before the occurrence of closed pores, in other word, at about 1000° C. The other is that the high oxygen concentration atmosphere firing is effected through the firing process. In both cases, the transfer of oxygen in the closed pore is sufficiently achieved through the oxygen defect in the pyrochlore phase which present at the grain boundaries, thus making it possible to produce fine, dense ceramics. In brief, in order to obtain fine, dense ceramics, it is sufficient that the high oxygen concentration atmosphere firing is initiated at a temperature just before the occurrence of closed pores. Accordingly, in the former schedule, the forming bodies may be fired in air before the occurrence of closed pores, or after the end of the sintering.

The piezoelectric ceramics to be produced by the method of the present invention have been limited to those having the aforesaid composition with or without a certain amount of one or more assistant components, for the following reasons.

If the content of the component $Pb(Sn_\alpha Sb_{1-\alpha})O_3$ is less than 0.01 mole, no pyrochlore crystal phase with oxygen defect which contributes to the promotion of sintering is formed during the firing in the high oxygen concentration atmosphere. If the content of $Pb(Sn_\alpha Sb_{1-\alpha})O_3$ exceeds 0.40 mole, it is difficult to obtain high electromechanical coupling coefficient (Kp) more than 5% and, it causes the difficulty in sintering because of the residual pyrochlore phase in the perovskite phase.

If the content of $PbTiO_3$ is less than 0.01 mole, the piezoelectricity is never obtained. Also, if the content of $PbZrO_3$ exceeds 0.96 mole, the piezoelectricity is never obtained.

The reason why $\alpha$ is limited within the range of $\frac{1}{4}$ to $\frac{3}{4}$ is that $\alpha$ outside of this range results in the difficulty in sintering because of the formation of other new pyrochlore phase ($Pb_2Sb_2O_7$, $\alpha < \frac{1}{4}$) or that of $PbSnO_3$ with no oxygen defect, and makes it impossible to obtain sufficiently porefree ceramics even when the composition is fired in the high oxygen concentration atmosphere.

The addition of Mn contributes to improvement in the electromechanical coupling coefficient, but the addition more than 5.0 wt% when converted into $MnO_2$ causes the difficulty in sintering and polarization. The addition of Mg restrains the grain growth and contributes to improvement in the temperature characteristics of center or resonant frequency of filters or resonators, but the addition more than 5.0 wt% when converted into MgO causes the difficulty in sintering and polarization. The addition of Cr contributes to improvement in the heat aging characteristics, i.e., resistance to heat aging, but the addition more than 5.0 wt% when converted into $Cr_2O_3$ causes the difficulty in sintering and polarization. Although these assistant components exert their respective effects by incorporating them into the composition in an amount more than 0.5 wt% in terms of their respective oxide forms, the compositions containing less than 0.5 wt% are also included in the scope of the present invention.

BRIEF DESCRIPTION OF THE DRAWINGS:

The invention will be further apparent from the following description with reference to examples and accompanying drawings, in which.

Before describing the practical examples of the present invention, physical arrangement and use of an alumina tube furnace used for embodying the present invention are briefly described below for making it easy to understand the invention.

Figure 4:
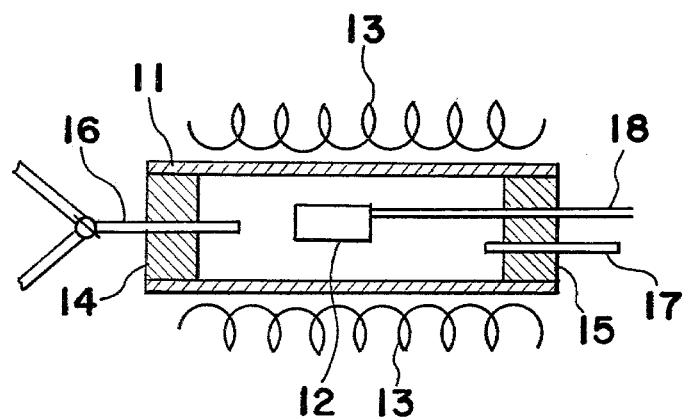
FIG. 4 is a schematic section view of an alumina tube furnace used for embodying the present invention.

Referring to FIG. 4, an alumina tube furnace for embodying the present invention comprises an alumina tube 11 adapted to be closed by plugs 14 and 15 at its both ends and heated by a heater 13 surrounding the alumina tube 11. In the alumina tube 11, there is an alumina sagger 12 in which PbO and $ZrO_2$ powder is placed to form a lead oxide atmosphere which prevent the evaporation of PbO from the composition during firing. Numeral 16 is an inlet for feeding oxygen gas or a mixture of oxygen and air into the alumina tube 11, and numeral 17 is an outlet for exhausting atmosphere gas in the alumina tube 11. The temperature in the furnace is taken by a thermocouple 18.

Using the above furnace, the firing is conducted in the following manner: The forming bodies are placed in the alumina saggar 12 containing a suitable amount of PbO and $ZrO_2$ powder which prevent the evaporation of PbO from the forming bodies. After making the alumina tube 11 shut tight, the alumina tube 11 is heated by the heater to an elevated temperature ranging from 1000° to 1350° C., while introducing oxygen atmosphere gas containing not less than 80 vol% oxygen. The atmosphere-gas flow rate is selected within the range of 1 to 100 l/hr so that the lead oxide atmosphere in the alumina saggar is kept constant and, that the vapor pressure of PbO in the sagger is kept at a value sufficient to prevent the evaporation of PbO from the composition but insufficient to cause the diffusion of PbO into the composition curing firing.

EXAMPLE 1

Fine powder of PbO, $TiO_2$, $ZrO_2$, $SnO_2$, $Sb_2O_3$, $MnO_2$, $Mg(OH)_2$, $Cr_2O_3$, $BaCO_3$, $CaCO_3$, $SrCO_3$ and $CdCO_3$ were used as raw materials. Thes materials were weighed according to the above general formula to provide piezoelectric ceramic compositions having the compositional proportions shown in Table 1, and then wet-milled in a ball mill for 20 hours. The resultant slurry was dried, and calcined for 2 hours at 700° to 900° C. The calcined body was wet-ground together with a suitable organic binder, dried and then granulated to provide fine-grained powder. The resultant powder was formed into plates of 50 mm square and 1.2 mm thick, or disks of 22 mm diameter and 1.2 mm thick at a pressure of 1000 kg/cm². Using the alumina tube furnace shown in FIG. 4, the plates and disks were fired at about 1250° C. for 2 hours in an oxygen atmosphere. The concentration of oxygen in the atmosphere is shown in Table 1.

TABLE 1

| Sample No. | α | Main Component (mol fraction) | | | Repl. Element (atomic %) | Ass. Component (wt %) | | | $O_2$ conc. (%) |
|---|---|---|---|---|---|---|---|---|---|
| | | x | y | z | | Mn | Mg | Cr | |
| 1 | ½ | 0.01 | 0.98 | 0.01 | Ba: 5.0 | — | — | — | 100 |
| 2 I | ¾ | 0.01 | 0.60 | 0.39 | Sr: 3.0 | 0.03 | — | 2.0 | 100 |
| 3 I | ¼ | 0.01 | 0.60 | 0.39 | — | 1.0 | — | 2.0 | 90 |
| 4 | ¾ | 0.01 | 0.55 | 0.44 | Ca: 1.0 | 0.3 | — | — | 100 |
| 5 N | ½ | 0.01 | 0.44 | 0.55 | Cd: 2.0 | 2.0 | — | 2.0 | 85 |
| 6 F | ¼ | 0.01 | 0.40 | 0.59 | Sr: 15.0 | 1.0 | 3.0 | 1.0 | 100 |
| 7 F* | ¾ | 0.01 | 0.40 | 0.59 | — | 5.5 | — | — | 100 |
| 8 F* | ¼ | 0.01 | 0.40 | 0.59 | Ca: 5.0 | — | 6.0 | — | 100 |
| 9 F* | ¼ | 0.01 | 0.40 | 0.59 | Ba: 5.0 | — | — | 5.5 | 95 |
| 10 J | ¼ | 0.01 | 0.30 | 0.69 | Sr: 5.0 | 0.5 | 1.0 | — | 95 |
| 11 J* | ¾ | 0.01 | 0.30 | 0.69 | Ba: 17.0 Sr: 5.0 | 0.05 | 0.05 | 0.05 | 100 |
| 12 B | ¾ | 0.01 | 0.04 | 0.95 | — | 1.0 | — | 1.0 | 80 |
| 13 | ¼ | 0.03 | 0.77 | 0.20 | — | — | — | — | 90 |
| 14 C | ¼ | 0.04 | 0.01 | 0.95 | Ba: 2.0 Ca: 2.0 | 2.0 | — | — | 100 |
| 15 | ¾ | 0.05 | 0.55 | 0.40 | — | — | — | — | 100 |
| 16 | ¼ | 0.05 | 0.55 | 0.40 | — | 0.05 | — | — | 85 |
| 17 | ¼ | 0.05 | 0.55 | 0.40 | — | 0.05 | — | 0.05 | 100 |
| 18 | ¼ | 0.05 | 0.55 | 0.40 | — | 0.05 | 0.1 | 0.05 | 100 |
| 19 | ¼ | 0.05 | 0.35 | 0.60 | Ba: 2.0 Sr: 3.0 Cd: 4.0 | 1.0 | 1.0 | 1.0 | 100 |
| 20 | ¼ | 0.05 | 0.30 | 0.65 | — | 0.4 | — | — | 85 |
| 21 | ¼ | 0.05 | 0.30 | 0.65 | — | 0.4 | 4.0 | — | 100 |
| 22 | ¾ | 0.05 | 0.10 | 0.85 | — | 0.4 | — | — | 90 |
| 23 | ¾ | 0.05 | 0.10 | 0.85 | — | 0.4 | — | 4.0 | 100 |
| 24 | ¼ | 0.07 | 0.85 | 0.08 | — | — | 0.1 | — | 100 |
| 25 | ¼ | 0.10 | 0.75 | 0.15 | Ba: 3.0 Ca: 3.0 Sr: 3.0 Cd: 3.0 | 5.0 | — | 5.0 | 100 |
| 26 | ¼ | 0.10 | 0.60 | 0.30 | — | 1.0 | — | — | 95 |
| 27 | ¼ | 0.10 | 0.43 | 0.47 | — | — | — | — | 80 |
| 28 | ¼ | 0.10 | 0.43 | 0.47 | — | 2.0 | — | — | 100 |
| 29 | ¼ | 0.10 | 0.43 | 0.47 | — | — | — | 2.0 | 90 |
| 30 | ¼ | 0.10 | 0.43 | 0.47 | — | — | 2.0 | — | 80 |
| 31 | ¼ | 0.10 | 0.20 | 0.70 | Ba: 5.0 | 1.0 | — | — | ·95 |
| 32 | ¾ | 0.10 | 0.10 | 0.80 | — | 2.0 | — | 1.0 | 85 |

TABLE 1-continued

| Sample No. | α | Main Component (mol fraction) | | | Repl. Element (atomic %) | Ass. Component (wt %) | | | O₂ conc. (%) |
|---|---|---|---|---|---|---|---|---|---|
| | | x | y | z | | Mn | Mg | Cr | |
| 33 | ½ | 0.14 | 0.85 | 0.01 | — | 0.1 | 0.1 | 0.1 | 100 |
| 34 | ⅔ | 0.15 | 0.65 | 0.20 | Sr: 5.0 | — | 1.5 | 1.5 | 90 |
| 35 M | ½ | 0.15 | 0.60 | 0.25 | — | — | — | 0.7 | 100 |
| 36 | ½ | 0.15 | 0.45 | 0.40 | Ca: 5.0 | — | — | — | 100 |
| 37 | ½ | 0.15 | 0.45 | 0.40 | Ca: 5.0 | — | — | 0.1 | 100 |
| 38 P | 9/20 | 0.15 | 0.35 | 0.50 | — | 3.0 | 3.0 | 3.0 | 90 |
| 39 | ½ | 0.15 | 0.30 | 0.55 | — | — | — | — | 95 |
| 40 | ½ | 0.15 | 0.30 | 0.55 | — | 1.0 | — | — | 100 |
| 41 | ½ | 0.15 | 0.30 | 0.55 | — | 1.0 | — | 1.0 | 85 |
| 42 | ½ | 0.15 | 0.30 | 0.55 | — | 1.0 | 1.0 | 1.0 | 100 |
| 43 K | ⅔ | 0.15 | 0.25 | 0.60 | Cd: 5.0 | 0.6 | — | — | 100 |
| 44 | ½ | 0.15 | 0.15 | 0.70 | Cd: 15.0 | 3.0 | — | — | 100 |
| 45 | ⅔ | 0.15 | 0.10 | 0.75 | Cd: 10.0 | 3.0 | — | 3.0 | 80 |
| 46 | ½ | 0.15 | 0.01 | 0.84 | — | 4.0 | 4.0 | — | 100 |
| 47 | ⅔ | 0.20 | 0.70 | 0.10 | — | — | — | 0.2 | 100 |
| 48 | ½ | 0.20 | 0.55 | 0.25 | — | — | 1.5 | 1.5 | 100 |
| 49 | ⅔ | 0.20 | 0.50 | 0.30 | — | 0.4 | 1.8 | — | 95 |
| 50 | ½ | 0.20 | 0.35 | 0.45 | — | 0.1 | 0.1 | — | 100 |
| 51 | 9/20 | 0.20 | 0.30 | 0.50 | Ba: 2.0 Sr: 2.0 | 5.0 | — | 5.0 | 100 |
| 52 | ½ | 0.20 | 0.20 | 0.60 | Sr: 15.0 | 2.0 | — | 2.0 | 100 |
| 53 | ½ | 0.20 | 0.20 | 0.60 | Sr: 15.0 | 2.0 | 2.0 | 2.0 | 95 |
| 54 | 9/20 | 0.20 | 0.10 | 0.70 | — | 0.05 | — | — | 100 |
| 55 | ½ | 0.25 | 0.74 | 0.01 | — | 1.0 | 1.0 | 1.0 | 100 |
| 56 | ½ | 0.25 | 0.60 | 0.15 | Sr: 5.0 | 0.8 | 0.4 | 1.2 | 85 |
| 57 G | ⅔ | 0.25 | 0.50 | 0.25 | Cd: 5.0 | 1.0 | 1.0 | 1.2 | 80 |
| 58 | ½ | 0.25 | 0.40 | 0.35 | — | — | — | — | 100 |
| 59 | ½ | 0.25 | 0.40 | 0.35 | — | — | — | 0.05 | 100 |
| 60 | ½ | 0.25 | 0.40 | 0.35 | — | 0.05 | — | 0.05 | 100 |
| 61 | ½ | 0.25 | 0.40 | 0.35 | — | 0.05 | 0.05 | 0.05 | 100 |
| 62* | ½ | 0.25 | 0.40 | 0.35 | Ca: 11.0 Cd: 11.0 | 0.05 | 0.05 | 0.05 | 95 |
| 63 L | 9/20 | 0.25 | 0.25 | 0.50 | — | 1.0 | 1.0 | — | 95 |
| 64 | ½ | 0.25 | 0.15 | 0.60 | — | 4.0 | — | 2.0 | 100 |
| 65 O | ½ | 0.25 | 0.01 | 0.74 | Ba: 5.0 | 3.0 | 3.0 | 0.3 | 80 |
| 66 | ½ | 0.30 | 0.60 | 0.10 | Sr: 5.0 | — | — | — | 100 |
| 67 | 9/20 | 0.30 | 0.55 | 0.15 | — | — | — | — | 100 |
| 68 | ½ | 0.30 | 0.45 | 0.25 | Ca: 10.0 | 0.3 | — | — | 85 |
| 69 | ⅔ | 0.30 | 0.25 | 0.45 | — | 0.3 | — | 0.3 | 100 |
| 70 | ⅔ | 0.30 | 0.05 | 0.65 | Cd: 5.0 | — | 0.3 | — | 100 |
| 71 | ½ | 0.34 | 0.65 | 0.01 | — | 0.1 | 0.1 | 0.1 | 100 |
| 72 | ½ | 0.35 | 0.35 | 0.30 | — | — | — | — | 95 |
| 73 | ½ | 0.35 | 0.10 | 0.55 | Ba: 6.0 Sr: 6.0 Ca: 6.0 | — | 1.0 | 1.0 | 95 |
| 74 | 9/20 | 0.39 | 0.60 | 0.01 | — | 5.0 | — | — | 90 |
| 75 | ⅔ | 0.40 | 0.40 | 0.20 | — | — | — | — | 100 |
| 76 | ⅔ | 0.40 | 0.20 | 0.40 | Sr: 5.0 | 1.0 | 1.0 | 1.0 | 100 |
| 77* | ⅔ | 0.40 | 0.20 | 0.40 | Sr: 2.1 | 1.0 | 1.0 | 1.0 | 80 |
| 78 D | ½ | 0/40 | 0.01 | 0.59 | — | — | — | — | 100 |

Using the piezoelectric ceramics produced by the above method, there were prepared resonators with the radial extensional mode or thickness expansion mode and acoustic surface wave filters in the following manner.

1. Preparation of Radial Extensional Mode Resonators

The piezoelectric ceramic disk was provided with a silver electrode on its each surface and then polarized in an insulating oil maintained at a temperature of 20° to 200° C., by applying a DC electric field of 3.0-4.0 kv/mm between the electrodes.

2. Preparation of Thickness Expansion Mode Resonators

The piezoelectric ceramic disk was lapped to obtain a thin disk with a thickness of 200 to 300 μm. The resultant thin disk was provided with a silver electrode on each surface by the vapour deposition method and polarized in an insulating oil maintained at a temperature of 20° to 200° C., by applying a DC electric field of 3.0-4.0 kv/mm between the electrodes. The silver electrodes was etched to form opposed circular electrodes having a diameter of 1-2 mm.

3. Preparation of Acoustic Surface Wave Filters

Figure 5:
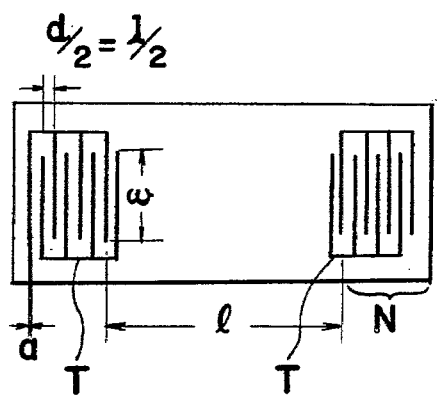
FIG. 5 is a schematic plane view of an acoustic surface wave filter showing the electrode constructions.

The piezoelectric ceramic plates was polished its one surface to obtain the surface roughness not more than 1μ. The polished plates was provided with gold layers on both surfaces by the vapour deposition method, and then polarized in an insulating oil maintained at a temperature of 20° to 200° C. After the poling treatment, the gold layer was etched to form transducer electrodes T comprising interdigital electrodes shown in FIG. 5. The dimensions of the electrodes are as follows: w=1.5 mm, a=53 μm, d/2=λ/2=106 μm, l=10 mm, N The number of pairs of electrodes)=20.

The thus prepared radial extentional mode resonators were subjected to the measurements of the permittivity ($\epsilon_{33}$), electromechanical coupling factor (Kp) and mechanical quality factor (Qmp).

The thickness expansion mode resonators were kept in an oven for 1 hour at 150° C. to carry out the first heat aging, and then determined the electromechanical coupling coefficient (kt[1]) and mechanical quality factor (Qmt). After that, the resonators were again kept in the oven under the same conditions to carry out the second heat aging, and then determined the electromechanical coupling coefficient (kt[2]).

It is to be noted that the heat aging is usually made just after the poling treatment in order to stabilize the piezoelectric properties so that the results after the second heat aging show the heat aging characteristics of the ceramics.

The acoustic surface wave filter was subjected to measurements of the electromechanical coupling coefficient of acoustic surface waves ($K_{SAW}$), temperature coefficient of center frequency ($f_{0SAW}$), ($\epsilon_{33}\epsilon_{11})^{\frac{1}{2}}$, and the propagation loss of acoustic surface waves (L). The impedance ($|Z|$) of the filter was calculated from capacitance of the interdigital electrodes.

The dielectric constant ($\epsilon_{33}$, $\epsilon_{11}$) of the radial extensonal mode resonators and thickness expansion mode resonators were measured with a capacitance bridge and, the electromechanical coupling coefficients (Kp, Kt) and mechanical quality factor (Qmp, Qmt) were measured with the IRE standard circuits.

Results are shown in Table 2 together with curie temperatures for the samples having a curie temperature not less than 290° C.

In Tables 1 and 2, the asterisks (*) designate ceramics having a composition out of the scope of the present invention.

The electromechanical coupling coefficient of acoustic surface waves ($K_{SAW}$) was obtained by the following equation:

$$(V_2-V_1)/V_1 = 1 - \sqrt{1-+(K_{SAW})^2} = -\tfrac{1}{2}(K_{SAW})^2$$

where $V_1$ = acoustic surface wave velocity in the case of that no metal layer is provided on the propagation path.

$V_2$ = acoustic surface wave velocity in the case of that no metal layer is provided on the propagation path.

The temperature coefficient of center frequency was obtained by the following equation:

$$\text{Temperature coefficient } (C_{fo \cdot SAW}) = \frac{f_{max} - f_{min}}{f_{20°C}} \times \frac{1}{100} \text{ (ppm/°C.)}$$

where $f_{20°C}$ = center frequency at 20° C.

$f_{max}$ = maximum value of center frequency at a temperature within the range of −20° C. to +80° C.

$f_{min}$ = minimum value of center frequency at a temperature within the range of −20° C. to +80° C.

The propagation loss of the acoustic surface wave filter was determined in the following manner.

Figure 6:
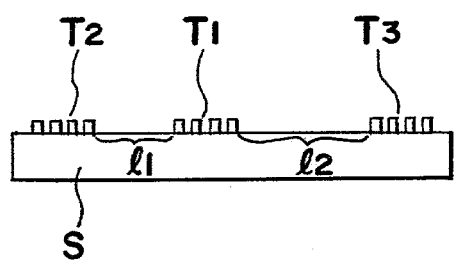
FIG. 6 is a schematic section view of an acoustic surface wave filter showing the arrangement of electrodes for determination of propagation loss of acoustic surface waves.

Using the above piezoelectric ceramic plates, acoustic surface wave filters having a center frequency of 10 MHz were prepared as shown in FIG. 6 by providing interdigital transducer electrodes $T_1$, $T_2$, and $T_3$ on the surface of plate substrate S, the electrodes $T_2$ and $T_3$ being remote from the interdigital transducer electrode $T_1$ by $l_1$ and $l_2$ ($l_1 = l_2$), respectively. The electrodes have the same dimension that in FIG. 5.

The propagation loss (L) was calculated by the following equation:

$$L = (L_1 - L_2)/(l_1 - l_2) \text{ (dB/cm)}$$

where $L_1$ and $L_2$ are the propagation losses produced during the propagation of acoustic surface waves from the transducing electrode $T_1$ to the transducing electrodes $T_2$ and $T_3$, respectively.

TABLE 2

| Sample No. | Curie temp. (°C.) | Extensional mode | | | Thickness expansion mode | | | | acoustic surface wave mode | | | | |
|---|---|---|---|---|---|---|---|---|---|---|---|---|---|
| | | $\epsilon_{33}$ | Kp (%) | Qmp | Kt[1] (%) | Kt[2] (%) | change rate (%) | Qmt | $K_{SAW}$ (%) | $C_{fo.SAW}$ (PPm/C) | $(\epsilon_{33}\epsilon_{11})^{\frac{1}{2}}$ | z (Ω) | propagation loss (dB/cm) |
| 1 | 480 | 197 | 5 | 126 | — | — | — | — | | | | | |
| 2 I | 377 | 588 | 30 | 115 | 20.0 | 19.8 | 1.0 | 98 | | | | | |
| 3 I | 380 | 571 | 32 | 1653 | 22.1 | 21.8 | 1.4 | 615 | | | | | |
| 4 | 374 | 583 | 35 | 1518 | 31.9 | 30.3 | 5.0 | 506 | | | | | |
| 5 N | 320 | 473 | 36 | 1885 | 30.7 | 30.3 | 1.3 | 777 | 18.7 | +40 | 579 | 105 | 0.5 |
| 6 F | 301 | 495 | 33 | 2018 | 25.4 | 25.0 | 1.6 | 916 | 17.2 | +21 | 566 | 108 | 0.6 |
| 7 F* | | — | — | — | — | — | — | — | | | | | |
| 8 F* | | — | — | — | — | — | — | — | | | | | |
| 9 F* | | — | — | — | — | — | — | — | | | | | |
| 10 J* | | 418 | 32 | 3018 | 20.3 | 19.2 | 5.4 | 1320 | 16.7 | −25 | 477 | 113 | 0.6 |
| 11 J* | | 1620 | 2 | 100 | — | — | — | — | | | | | |
| 12 B | | 215 | 6 | 2003 | — | — | — | — | 8.9 | −75 | 250 | 239 | 0.4 |
| 13 | 422 | 250 | 18 | 144 | — | — | — | — | | | | | |
| 14 C | | 183 | 8 | 2156 | — | — | — | — | 11.3 | −70 | 217 | 275 | 0.5 |
| 15 | 355 | 564 | 32 | 188 | 28.2 | 26.8 | 5.0 | 101 | | | | | |
| 16 | 350 | 476 | 31 | 1953 | 27.9 | 26.4 | 5.4 | 705 | | | | | |
| 17 | 361 | 453 | 33 | 2081 | 28.5 | 28.1 | 1.4 | 724 | | | | | |
| 18 | 363 | 434 | 35 | 2103 | 29.1 | 28.8 | 1.0 | 741 | | | | | |
| 19 | | 385 | 34 | 2560 | 28.8 | 28.4 | 1.4 | 1359 | 17.8 | +15 | 425 | 46 | 0.3 |
| 20 | | 341 | 26 | 3827 | 20.7 | 19.6 | 5.3 | 1664 | 16.5 | +41 | 410 | 153 | 0.5 |
| 21 | | 332 | 25 | 3554 | 20.4 | 19.4 | 4.9 | 1703 | 16.3 | +10 | 402 | 161 | 0.4 |
| 22 | | 253 | 15 | 4896 | — | — | — | — | 15.4 | −65 | 301 | 218 | 0.6 |
| 23 | | 245 | 15 | 4523 | — | — | — | — | 15.3 | −58 | 297 | 225 | 0.3 |
| 24 | 464 | 201 | 8 | 273 | — | — | — | — | | | | | |
| 25 | 415 | 419 | 19 | 1574 | — | — | — | — | | | | | |
| 26 | 370 | 511 | 27 | 1649 | 20.0 | 18.9 | 5.5 | 653 | | | | | |
| 27 | 295 | 719 | 49 | 95 | 37.4 | 35.6 | 4.8 | 80 | | | | | |
| 28 | 292 | 682 | 45 | 1555 | 34.4 | 32.3 | 6.1 | 536 | | | | | |
| 29 | 297 | 702 | 46 | 143 | 35.0 | 34.5 | 1.4 | 102 | | | | | |
| 30 | 293 | 694 | 44 | 256 | 34.0 | 32.4 | 4.7 | 174 | | | | | |
| 31 | | 300 | 24 | 5857 | 4.8 | 4.5 | 6.3 | 976 | 16.0 | +32 | 378 | 175 | 0.4 |

TABLE 2-continued

| Sample No. | Curie temp. (°C.) | Extensional mode $\epsilon_{33}$ | Kp (%) | Qmp | Thickness expansion mode Kt$^1$ (%) | Kt$^2$ (%) | change rate (%) | Qmt | acoustic surface wave mode K$_{SAw}$ (%) | C$_{fo.SAW}$ (PPm/C) | $(\epsilon_{33}\epsilon_{11})^{\frac{1}{2}}$ | z (Ω) | propagation loss (dB/cm) |
|---|---|---|---|---|---|---|---|---|---|---|---|---|---|
| 32 |  | 246 | 13 | 3152 | — | — | — | — | 15.5 | +37 | 284 | 225 | 0.5 |
| 33 | 453 | 199 | 12 | 595 | — | — | — | — | | | | | |
| 34 | 398 | 300 | 28 | 251 | 4.9 | 4.9 | 0.0 | 125 | | | | | |
| 35 M | 359 | 532 | 31 | 137 | 21.0 | 20.7 | 1.4 | 116 | | | | | |
| 36 | 293 | 1254 | 52 | 95 | 40.2 | 38.2 | 5.0 | 901 | | | | | |
| 37 | 290 | 1107 | 49 | 142 | 37.7 | 37.2 | 1.3 | 80 | | | | | |
| 38 P |  | 777 | 38 | 2174 | 33.3 | 32.9 | 1.2 | 853 | | | | | |
| 39 |  | 666 | 38 | 201 | 33.2 | 31.6 | 4.8 | 110 | 19.0 | +45 | 718 | 93 | 18.0 |
| 40 |  | 581 | 34 | 3588 | 27.5 | 26.1 | 5.1 | 1496 | 17.5 | +42 | 600 | 100 | 0.6 |
| 41 |  | 563 | 35 | 3627 | 28.0 | 27.7 | 1.1 | 1612 | 17.5 | +43 | 600 | 100 | 0.6 |
| 42 |  | 545 | 36 | 4021 | 30.8 | 30.5 | 1.0 | 1875 | 18.8 | +15 | 583 | 110 | 0.4 |
| 43 K |  | 572 | 32 | 3452 | 23.4 | 22.1 | 5.6 | 1568 | 16.5 | +30 | 597 | 101 | 0.5 |
| 44 |  | 380 | 22 | 4645 | — | — | — | — | 15.7 | −31 | 442 | 111 |  |
| 45 |  | 321 | 12 | 4011 | — | — | — | — | 15.5 | −36 | 385 | 172 | 0.4 |
| 46 |  | 284 | 9 | 1712 | — | — | — | — | 15.0 | −73 | 354 | 183 | 0.6 |
| 47 | 403 | 238 | 19 | 176 | — | — | — | — | | | | | |
| 48 | 333 | 811 | 29 | 256 | 21.1 | 20.8 | 1.4 | 174 | | | | | |
| 49 | 317 | 482 | 33 | 763 | 25.6 | 24.3 | 5.1 | 305 | | | | | |
| 50 |  | 855 | 35 | 1673 | 32.4 | 30.7 | 5.2 | 557 | | | | | |
| 51 |  | 490 | 33 | 2436 | 21.0 | 20.7 | 1.4 | 974 | 17.0 | +25 | 581 | 108 | 0.5 |
| 52 |  | 465 | 26 | 2795 | 5.0 | 5.0 | 0.0 | 47.5 | 16.1 | −42 | 568 | 113 | 0.5 |
| 53 |  | 457 | 25 | 2911 | 4.9 | 4.9 | 0.0 | 489 | 16.1 | −18 | 655 | 119 | 4 |
| 54 |  | 360 | 10 | 4815 | — | — | — | — | 15.0 | −30 | 404 | 158 | 0.5 |
| 55 | 425 | 201 | 18 | 518 | — | — | — | — | | | | | |
| 56 | 351 | 297 | 23 | 1021 | — | — | — | — | | | | | |
| 57 G | 303 | 734 | 32 | 2759 | 20.4 | 20.1 | 1.5 | 1083 | | | | | |
| 58 |  | 1107 | 28 | 152 | 22.5 | 21.4 | 4.9 | 110 | | | | | |
| 59 |  | 1062 | 28 | 173 | 22.4 | 22.1 | 1.3 | 115 | | | | | |
| 60 |  | 905 | 26 | 1318 | 21.1 | 20.9 | 0.9 | 400 | | | | | |
| 61 |  | 894 | 25 | 1523 | 21.0 | 20.8 | 1.0 | 434 | | | | | |
| 62 * |  | 1753 | 3 | 133 | — | — | — | — | | | | | |
| 63 L |  | 512 | 27 | 2558 | 20.6 | 19.6 | 4.9 | 1418 | | | | | |
| 64 |  | 437 | 19 | 2019 | — | — | — | — | 15.0 | −42 | 543 | 121 | 0.5 |
| 65 O |  | 459 | 6 | 2573 | — | — | — | — | 9.9 | −75 | 566 | 110 | 0.6 |
| 66 | 310 | 284 | 10 | 108 | — | — | — | — | | | | | |
| 67 | 292 | 401 | 12 | 125 | — | — | — | — | | | | | |
| 68 |  | 534 | 25 | 2108 | 4.8 | 4.5 | 6.3 | 364 | | | | | |
| 69 |  | 403 | 24 | 1956 | 5.0 | 5.0 | 0.0 | 287 | | | | | |
| 70 |  | 375 | 13 | 328 | — | — | — | — | | | | | |
| 71 | 303 | 244 | 8 | 593 | — | — | — | — | | | | | |
| 72 |  | 307 | 9 | 118 | — | — | — | — | | | | | |
| 73 |  | 294 | 7 | 294 | — | — | — | — | | | | | |
| 74 |  | 215 | 6 | 618 | — | — | — | — | | | | | |
| 75 |  | 273 | 6 | 128 | — | — | — | — | | | | | |
| 76 |  | 244 | 5 | 466 | — | — | — | — | | | | | |
| 77 * |  | — | — | — | — | — | — | — | | | | | |
| 78 D |  | 235 | 5 | 248 | — | — | — | — | | | | | |

As will be evident from Tables 1 and 2, according to the present invention piezoelectric ceramics of the Pb(Sn$_\alpha$Sb$_{1-\alpha}$)O$_3$-PbTiO$_3$-PbZrO$_3$ system have been obtained which possess not less than 5% Kp and not less than 25% Kt and are small in the change rate of Kt resulting from the heat aging. The ceramics of Pb(Sn$_\alpha$Sb$_{1-\alpha}$)O$_3$-PbTiO$_3$-PbZrO$_3$ system have been proposed in U.S. Pat. No. 3,970,572. However, in the conventional air firing method there are such disadvantages that the sintering of the compositions of the Pb(Sn$_\alpha$Sb$_{1-\alpha}$)O$_3$-PbTiO$_3$-PbZrO$_3$ system is ensured only in a limited, narrow compositional area and that the variation of $\alpha$ requires the alteration in the Pb(Sn$_\alpha$Sb$_{1-\alpha}$)O$_3$ content. According to the present invention the sintering is ensured in a broader range of composition.

Figure 7:
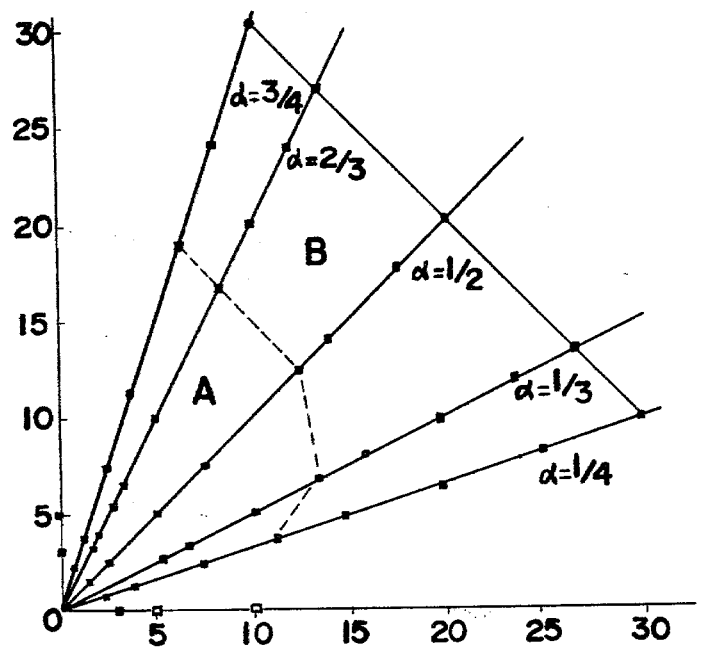
FIG. 7 is a graph showing the relation between the sintering property and the content of Sn, Sb.

FIG. 7 shows the relation between the sintering property and the content of Sn and Sb for Pb(Sn$_\alpha$Sb$_{1-\alpha}$)O$_3$. In the figure, the symbol ( ■ ) shows a composition which was converted into a dense, sintered body and the symbol ( □ ) shows a composition which was never converted into a sintered body. The normal air firing method enables to obtain sintered bodies when they have compositions falling within the area A defined by a broken line, while according to the present invention the composition which can be sintered is broadened to the areas A and B.

Figure 8:
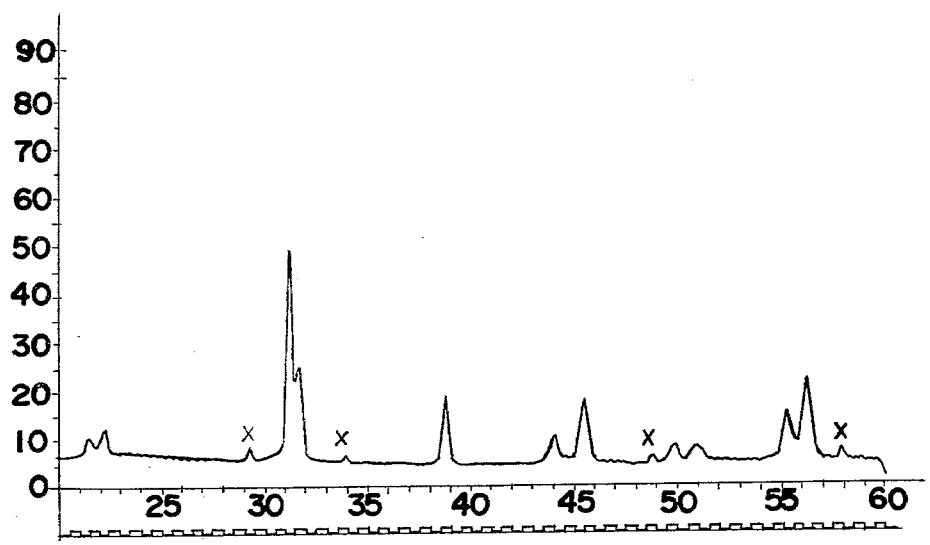
FIGS. 8 and 9 are X-ray diffraction patterns of reaction products obtained from the $Pb(Sn_\alpha Sb_{1-\alpha})O_3$-$PbTiO_3$-$PbZrO_3$ system.
Figure 9:
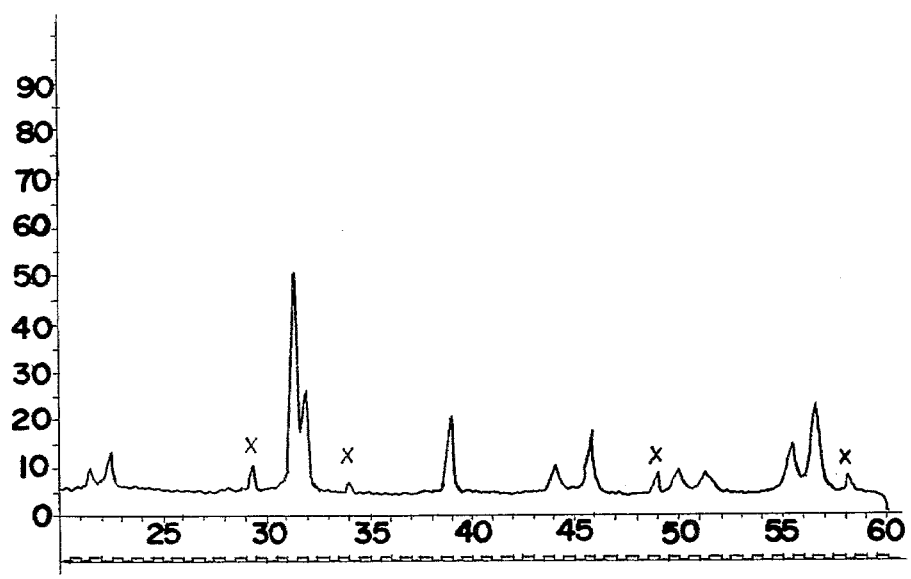
Figure 10:
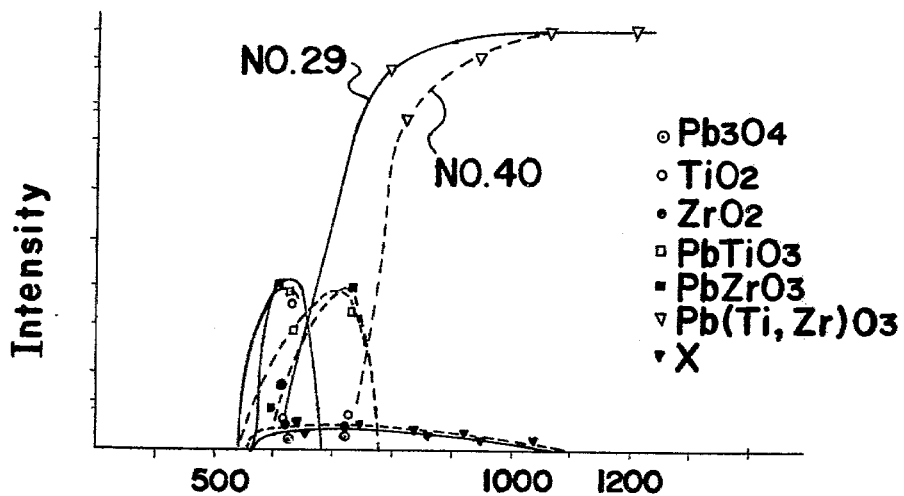
FIG. 10 is a graph showing relative X-ray intensity of the reaction products for $Pb(Sn_\alpha Sb_{1-\alpha})O_3$-$PbTiO_3$-$PbZrO_3$ system as a function of temperature.

FIGS. 8 and 9 show X-ray diffraction patterns for reaction products obtained by firing compositions corresponding to samples Nos. 5 and 16 at 1050° C. for 2 hours. As can be seen from these figures, the X-ray charts show peaks resulting from the presence of an unknown phase X in addition to the peaks due to Pb(Ti,Zr)O$_3$. In order to confirm this fact from another point of view, the forming bodies made of the compositions corresponding to samples Nos. 5 and 16 were calcined at various temperatures for 2 hours and then subjected to X-ray analysis to observe the state of the reaction products. Results are shown in FIG. 10. From this figure, it is confirmed that these compositions produce an unknown phase X in their reaction process and the phase X is present at the temperature within the range of about 600° C. to a temperature approximately equal to the temperature at which the sintering is completed.

From the above, it is concluded that the formation of the unknown phase X results from the component Pb(Sn$_\alpha$Sb$_{1-\alpha}$)O$_3$. For the identification of this unknown phase X, there were prepared mixtures of raw materials to provide composition of Pb(Sn$_\alpha$Sb$_{1-\alpha}$)O$_3$ wherein $\alpha$ takes a value of 0, 1/8, 1/4, 1/3, 1/2, 2/3, 3/4, 7/8 or 1. These mixtures were calcined at 900° C. for 2 hours, and the resultant products were determined with the X-ray analysis. Results are shown in Table 3.

TABLE 3

| α | phase |
|---|---|
| 1 | PbSnO$_3$ |
| 7/8 | PbSnO$_3$ + X |
| 3/4 | X |
| 2/3 | X |
| 1/2 | X |
| 1/3 | X |
| 1/4 | X |
| 1/8 | PbSb$_2$O$_6$ + X |
| 0 | PbSb$_2$O$_6$ |

From Table 3, it is seen that the unknown phase X is produced as a single phase only when takes a value within the range of 1/4 to 3/4. The single, unknown phase X with α=1/2 was indexed from the X-ray diffraction patterns. The results obtained are shown in Table 4. The unknown phase X has the face-centered cubic lattice with the lattice constant of 10.57 Å.

TABLE 4

| 2θ(deg.)* | d (Å) | hKl | S | I/I$_0$ (0/0) |
|---|---|---|---|---|
| 14.6 | 6.067 | 111 | 3 | 0.02 |
| 28.1 | 3.157 | 311 | 11 | 0.04 |
| 29.4 | 3.038 | 222 | 12 | 1.00 |
| 34.0 | 2.637 | 400 | 16 | 0.40 |
| 37.2 | 2.417 | 311 | 19 | 0.06 |
| 44.6 | 2.032 | 511 333 | 27 | 0.03 |
| 48.8 | 1.866 | 440 | 32 | 0.47 |
| 51.2 | 1.784 | 531 | 35 | 0.02 |
| 57.9 | 1.593 | 622 | 44 | 0.46 |
| 60.8 | 1.523 | 444 | 48 | 0.12 |

*CuK$_\alpha$
S = h$^2$ + k$^2$ + l$^2$

Identifying from the lattice constant and ionic radii of the constituent ions, the unknown phase X is a pyrochlore phase.

Figure 11:
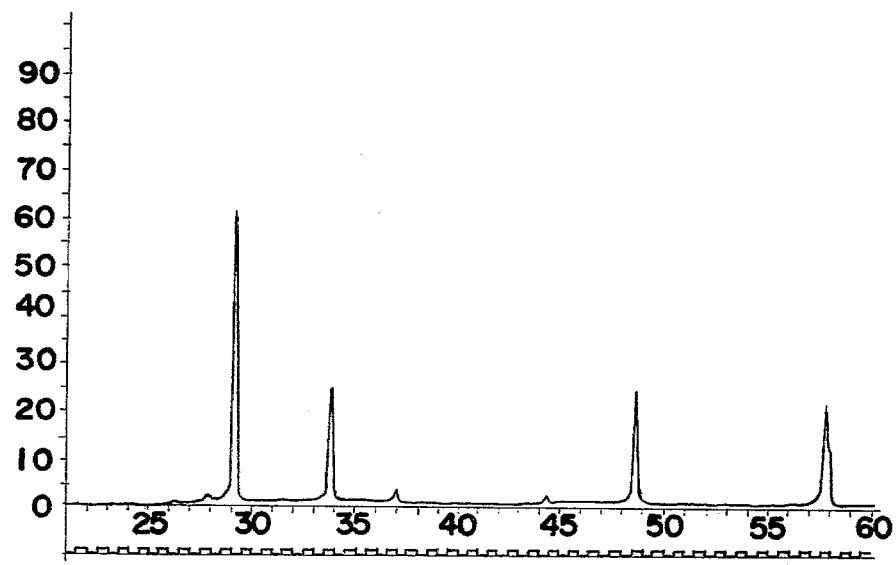
FIG. 11 is an X-ray diffraction pattern of a pyrochlore crystal phase resulting from the system $Pb(Sn_\alpha Sb_{1-\alpha})O_3$ with $\alpha = \frac{1}{2}$.

FIG. 11 shows X-ray diffraction pattern of the pyrochlore crystal phase resulting from a composition of Pb(Sn$_\alpha$Sb$_{1-\alpha}$)O$_3$ with α=1/2. From the comparison between the X-ray diffraction patterns of FIG. 11 and those of FIGS. 8 and 9 it will be seen that the unknown phase X agrees with the pyrochlore phase. Taking acount of ionic radii of Pb$^{2+}$(1.24 Å), Sn$^{4+}$(0.71 Å), Sb$^{5+}$(0.62 Å) and O$^{-2}$(1.40 Å) and the balance of their valencies, it is considered that in the system of Pb(Sn$_\alpha$Sb$_{1-\alpha}$)O$_3$ with α=1/2, this pyrochlore crystal structure may be expressed by the formula Pb$^{2+}$Sn$^{4+}$Sb$^{5+}$O$_{13/2}{}^{2-}$. Accordingly, the unknown phase X can be said to be a pyrochlore crystal phase with oxygen defect.

From the above paticulars, the phase X having the pyrochlore crystal structure with oxygen defect may be expressed by the formula Pb$_2$Sn$_{2\alpha}$Sb$_{2-2\alpha}$O$_{7-\alpha}$ wherein 1/4 ≤ α ≤ 3/4. This is supported by the facts that the measured density of pore-free, hot-pressed ceramics of Pb(Sn$_\alpha$Sb$_{1-\alpha}$)O$_3$ with a=1/2 is 8.50 to 8.52 g/cm$^3$, that the theoretical density of Pb$_2$SnSbO$_{13-/2}$□$_{1/2}$ is 8.52 g/cm$^3$ provided that it has oxygen defect (when no oxygen defect is present the theoritical density is 8.61 g/cm$^3$), and the results theoritically calculated from the diffraction intensity of X-ray diffraction patterns.

As disclosed above, this pyrochlore phase with oxygen defect promotes the solid reaction in the oxygen atmosphere, resulting in the formation of fine, dense ceramics with very low porosity and very small average pore size.

Figure 14:
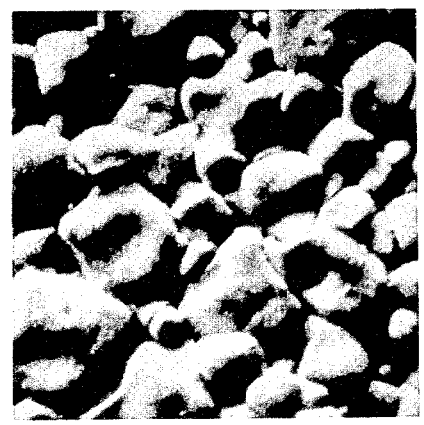
FIGS. 14 to 16 are scanning electron micrographs showing microstructures of various piezoelectric ceramics.
Figure 15:
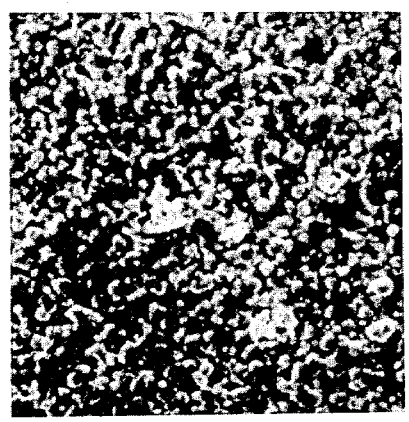
Figure 16:

Scanning electron micrographs taken from natural surfaces of the samples Nos. 5 and 16 are shown in FIGS. 14 and 15, respectively. FIG. 16 is a scanning electron micrograph taken from a natural surface of a comparative sample having a composition Pb(Ti$_{0.48}$Zr$_{0.52}$)O$_3$. This comparative sample was prepared under the same firing conditions as those used for the preparation of samples Nos. 5 and 16. The oxygen concentration in the firing atmosphere was 100 vol%.

As is evident from these figures, the piezoelectric ceramics according to the present invention are composed of fine spherical grains with uniform grain size, while the conventional ceramic of the comparative sample is composed of large, variform grains. It results from the formation of an intermediate phase, i.e., a pyrochlore phase with oxygen defect occurs for the Pb(Sn$_\alpha$Sb$_{1-\alpha}$)O$_3$-PbTiO$_3$-PbZrO$_3$ system. As disclosed previously with reference to FIG. 10, this pyrochlore phase with oxygen defect, expressed by the formula Pb$_2$Sn$_{2\alpha}$Sb$_{2-2\alpha}$O$_{7-\alpha}$, is formed at the grain boundaries in the early stage of the firing and is present up to an elevated temperature of about 1200° C. in the solid state. If the pyrochlore phase with oxygen defect is formed at the grain boundaries, it restraines grain growth and no pore agglomeration occurs, since its oxygen defect causes increase of the mobility of oxygen gas at the grain boundaries. In the final stage of the firing, this pyrochlore phase with oxygen defect transforms into the perovskite structure.

Thus, the present invention makes it possible to produce fine, dense piezoelectric ceramics with small pore size and very low porosity, which possess high mechanical strength, improved mechanical quality factor and high resistance to thermal shock. The piezoelectric ceramics produced according to the present invention enables to transform presently available designes into practical, commercial products. For example, since the ceramics have high mechanical strength, they make it possible to produce thickness expansion mode resonators for very high frequency applications in which the ceramics used are required to have a thin thickness, for example, of about 200 microns at 10.7 MHz, about 80 microns at 27 MHz, or about 40 microns at 58 MHz. Further, when the ceramics are applied to vibrators for high power applications, they enables to obtain high mechanical energy by applying high voltage, since there is restraint of corona discharge which may occur in the pores.

Further, according to the present invention it is possible to obtain the following concomitant advantages. Wheb industrially producing the forming bodies it is the usual practice to incorporate an organic binder into the composition. This organic binder is subjected to combustion during the firing, and products CO and CO$_2$ gas. Since CO gas has a reducing power, the reduction of PbO occurs. In addition, since the firing is carried out in the closed sagger, the combustion of the organic binder produces an oxygen-deficient atmosphere which has bad influence on the sintering of the ceramics. Such problems inherent to the conventional air sintering can be solved by the present invention. The electric and piezoelectric properties such as specific resistance, tan δ, dielectric constant are improved by 20 to 50%, compared with those obtained by the normal air firing method. Also, the scattering of these characteristics can be considerably reduced. When the piezoelectric ceramics produced by the present invention are applied to acoustic surface wave filters, the propagation loss of the acoustic surface waves is reduced by ⅓ to ⅕ times that obtained by the normal air firing method.

In FIG. 6, the compositions falling within the polygonal area AFGH included in the compositional area defined the polygonal area ABCDE are useful as materials for resonators for high temperature applications. The compositions falling within the polygonal area IJKLGM are useful as materials for high coupling applications. The compositions falling within the polygon NBCOLP are useful as materials for acoustic surface wave elements. The reason why experimental data in specific columns are excluded is that the composition is not suited for the applications disclosed therein.

EXAMPLE 2

This example is given in explanation of piezoelectric ceramics for acoustic surface wave filters. The composition corresponding to those of samples Nos. 19 and 31 in example 1 were used. Test specimens were prepared in the same manner that described in example 1 except for the concentration of oxygen which are shown in Table 5.

For comparison, comparative samples were also prepared by the hot-pressing method using the same composition that the above sample has. The hot-pressing conditions were 350 Kg/cm$^2$, 1200° C. and 2 hours.

Physical and mechanical properties of the resultant specimens are shown in Table 5.

The bulk density of ceramics was determined with the Archimedes' method using polished specimens with a thin wax layer which were immersed in a liquid bath of hexachlorl, 3-butadiene (density=1.6829 g/cm$^3$ at 20° C.). The results in the table are the average of 20 to 50 measurements for the each sample. The standard deviation ($\gamma$) is also shown in Table 5.

The pore sizes were determined with a reflecting microscope using polished specimens. The average grain sizes of the ceramics were determined with a scanning electron microscope using polished specimens which had been thermally etched at about 1200° C. for 1 hour in a lead oxide atmosphere. To determine the resistance to plastic deformation, the vickers' hardness was determined with a vickers' hardness tester (Model MVK, made by Akashi MFG. CO., LTD.) and calculated by the equation:

$$\text{Vickers' Hardness } (Hv) = \frac{2P \sin \theta}{d^2} \times 100 \text{ (Kg/mm)}$$

where
$\theta = 136°$
d = diagonal line length for impression
p = load

The deflective strength was determined with a universal testing machine using the three contact point method. The specimens were of 15 to 30 mm length, 3 to 5 mm width, and 0.5 to 3 mm thick. The average grain sizes were taken from the grains observed in the area of 100 square microns. The average pore sizes were determined from the number of pores and the areas of pores in 100 square microns provided that all the pores are of spherical.

EXAMPLE 3

This example is given by way of explanation on piezoelectric ceramics for ceramic vibrators. The compositions corresponding to samples Nos. 25, 27 and 34 were used. Test specimens were prepared in the same manner as described in example 2. The oxygen concentration is shown in Table 5. The compositions of samples Nos. 25 and 34 are suited for ceramic vibrators for high temperature applications.

For the comparison, comparative samples were also prepared by the hot-pressing technique in the same manner as described in example 2.

The bulk density, vickers' hardness, deflective strength, crystal grain size and average pore size were determined in the same manner described in example 2. The results are shown in Table 5.

In order to determine the strength of the ceramics, test specimens for samples Nos. 27-1 and 27-2 were applied an alternating voltage with an oscillating time of 0.01 sec. The supplied electric power per unit area was varied from 0 to 1100 W/cm$^2$. Ten specimens were used for each electric power. The number of broken ceramic vibrators is plotted in FIG. 12.

Figure 13:
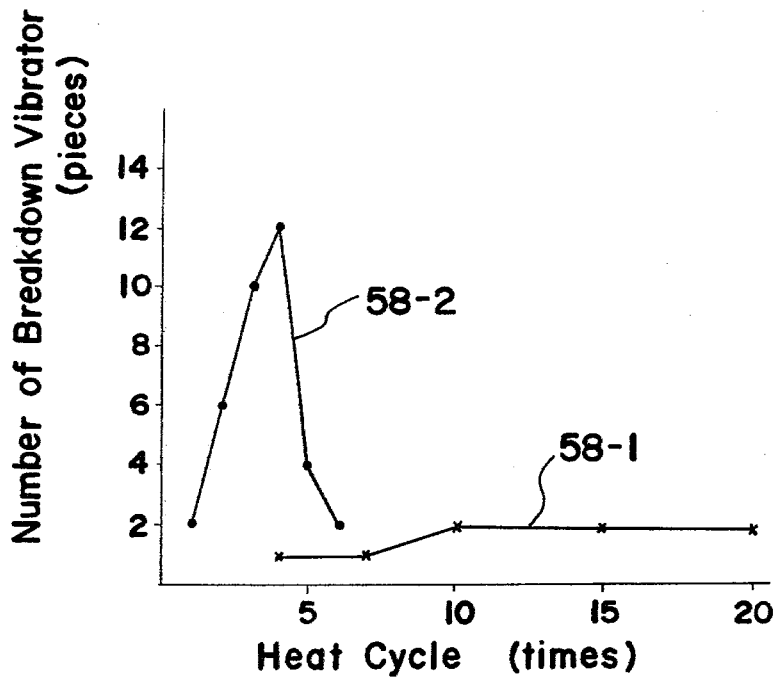
FIG. 13 is a graph showing the relation between the number of thermal breakdown ceramic vibrators and the number of heat sycles in the system $Pb(Sn_\alpha Sb_{1-\alpha})O_3$-$PbTiO_3$-$PbZrO_3$.

Test specimens for samples Nos. 34-1 and 34-2 were subjected to thermal shock test. The test was conducted at temperatures ranging from room temperature to 250° C. in the following manner. The specimens were allowed to stand for 20 min. at room temperature and 250° C. alternately, and the heat cycle from the room temperature to 250° C. or vise versa was about 2 sec. The number of test specimens was 36 pieces. FIG. 13 shows the relation between the number of the cycles and that of thermally broken specimens.

Figure 12:
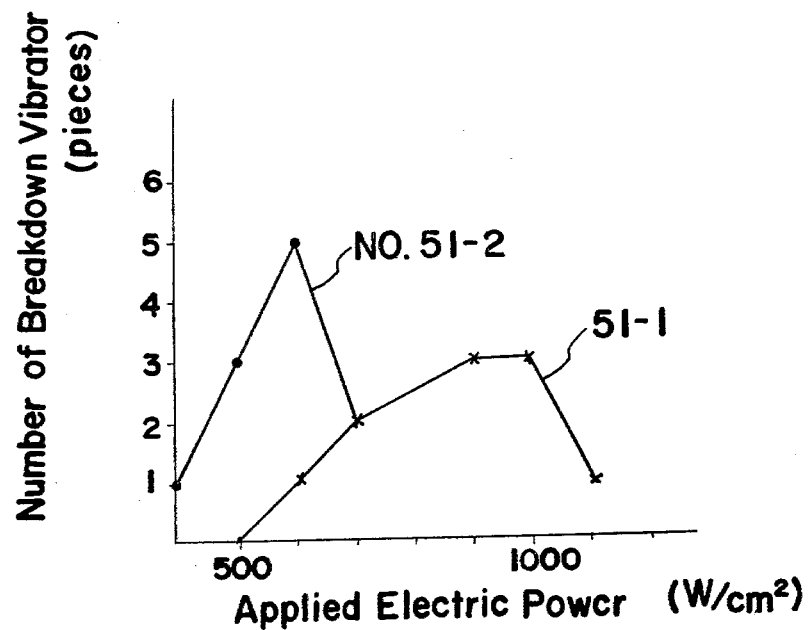
FIG. 12 is a graph showing the relation between the number of breakdown ceramic vibrators and the applied electric power in the system $Pb(Sn_\alpha Sb_{1-\alpha})O_3$-$PbTiO_3$-$PbZrO_3$.

As can be seen from FIGS. 12 and 13, the high oxygen concentration firing process enables to produce ceramic vibrators for high temperature applications with high resistance to thermal shock.

EXAMPLE 4

This example is given in explanation of piezoelectric ceramics for ceramic filters.

Using the compositions corresponding to samples Nos. 18 and 28, test specimens were prepared in the same manner as described in example 2. The oxygen concentration for each sample is shown in Table 5. The composition of sample No. 18 is suited for radial extentional mode filters and the composition of sample No. 28 is for thickness expansion mode filters.

For the comparison, the above compositions were hot pressed under the same conditions as described in example 2.

The bulk density, vickers' hardness, deflective strength, grain size and average pore size of the resultant ceramics were determined in the same manner as described in example 2. The results are shown in Table 5.

Results for comparative samples made of a composition 0.48PbTiO$_3$−0.52PbZrO$_3$+0.5wt% Al$_2$O$_3$+0.5wt% SiO$_2$ of the prior art are also shown in Table 5. The test specimens of the comparative samples Nos. R-1 and R-2 were prepared by firing in oxygen atmospheres with oxygen concentration shown in Table 5 and those of the comparative sample No. R-4 were prepared by hot-pressing under the aforesaid conditions.

In Table 5, the data for the vickers' hardness, deflective strength, grain size and average pore size are the averages of ten measurements and the asterisks (*) show the ceramics out of the scope of the present invention.

As can be seen from this table, the present invention makes it possible to produce piezoelectric ceramics with low porosity, small average pore size, and fine grain size comparable to those obtained by the present invention have high vickers' hardness and high deflective strength comparable to those obtained by hot-pressing.

Figure 17:
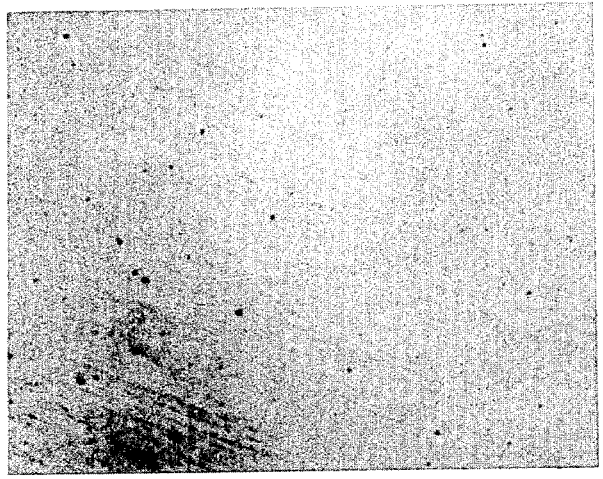
FIGS. 17 to 20 are reflecting micrographs showing microstructures of various ceramics with polished surfaces.
Figure 18:
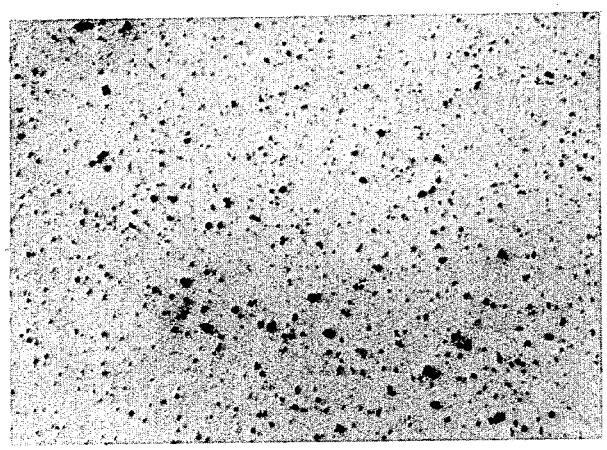
Figure 19:
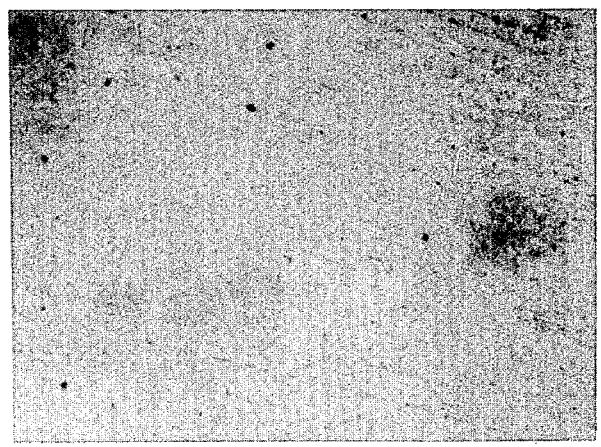
Figure 20:
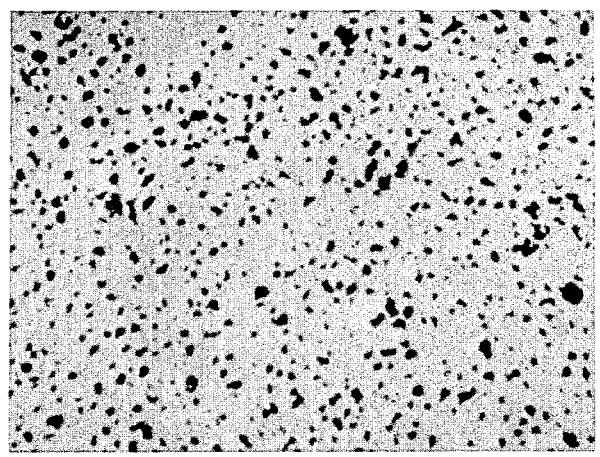

Reflecting micrographs of the polished ceramics are shown in FIGS. 17 to 20. In these figures, FIG. 17 shows a microstructure of sample No. 19-1 (×1000), FIG. 18 that of sample No. 19-2 (×200), FIG. 19 that of sample No. 19-3 (×1000), and FIG. 20 that of sample No. R-1 (×200). From these figures, it is observed that the ceramics (No. 19-1) obtained by the present invention have fewer pores and small pore size, comparable to those obtained by the hot-pressing.

Figure 21:
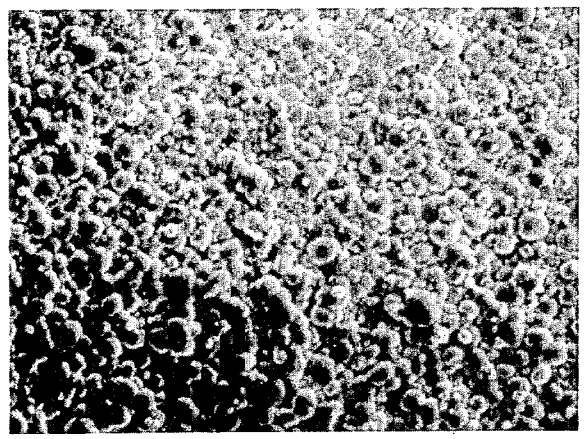
FIGS. 21 and 28 are scanning electron micrographs showing microstructures of piezoelectric ceramics produced according to the present invention and the prior art.
Figure 22:
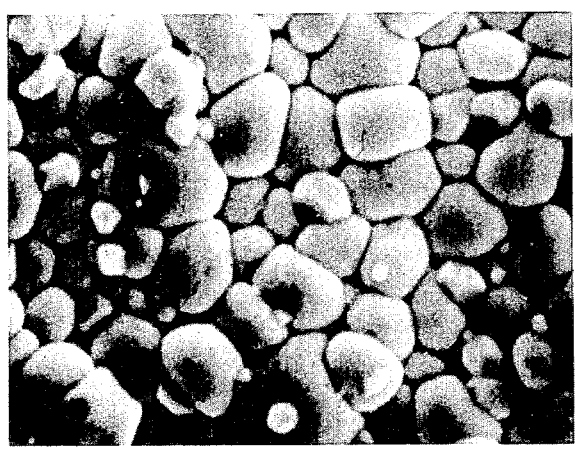
Figure 23:
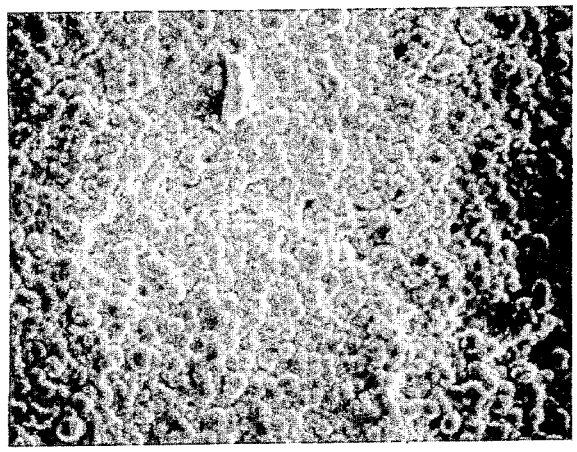
Figure 24:
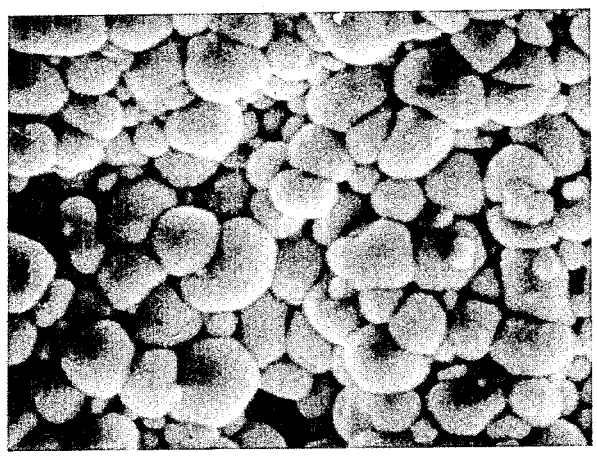
Figure 25:
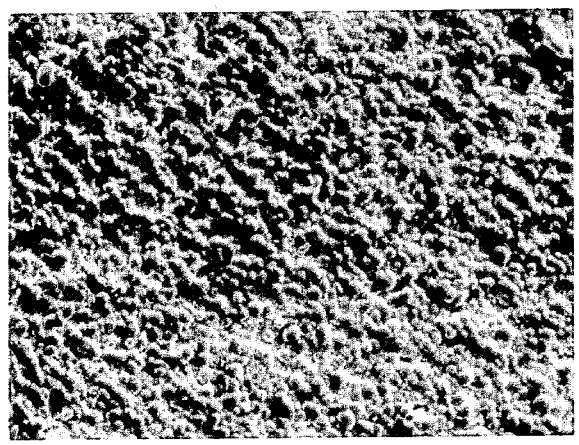
Figure 26:
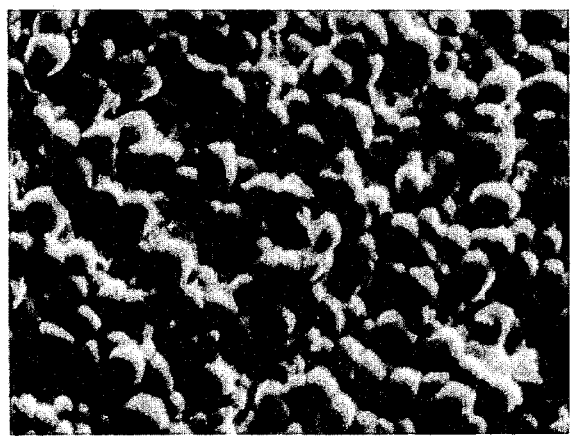
Figure 27:
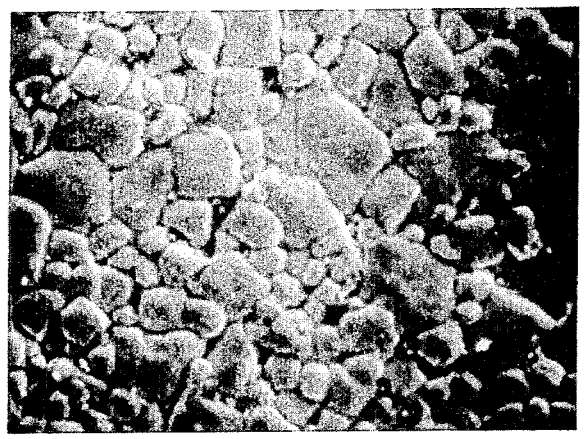
Figure 28:
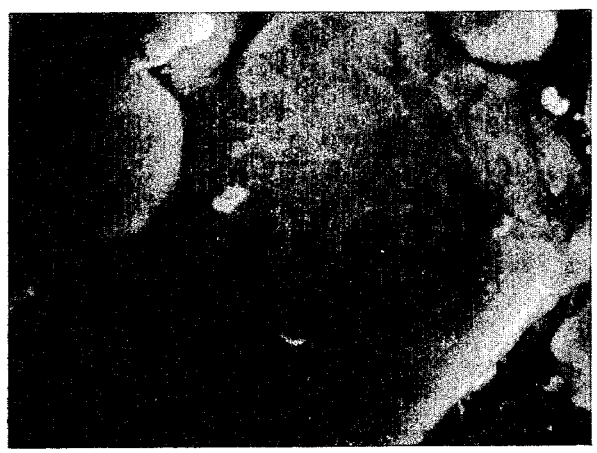

FIGS. 21 to 28 are scanning electron micrographs of the ceramics of the above samples. FIG. 21 and 22 show the microstructure of sample No. 19-1, FIGS. 23 and 24 show that of sample No. 19-2, FIGS. 25 and 26 show that of sample No. 19-3, and FIGS. 27 and 28 show that of sample No. R-1. From these figures, it is clear that the ceramics obtained by the present invention have smaller pore sizes and fewer pores as compared with the comparative sample No. R-1. It is also understood that in the prior art ceramics (sample No. R-1) it is difficult to obtain small average pore sizes and fewer pores even if they are produced according to the present invention.

Although there is a fear of contamination with impurities such as $Al_2O_3$, $SiO_2$ and so on which have been contained in the raw materials used, such unavoidable contamination is allowed in the process of the present invention.

Figure 1:
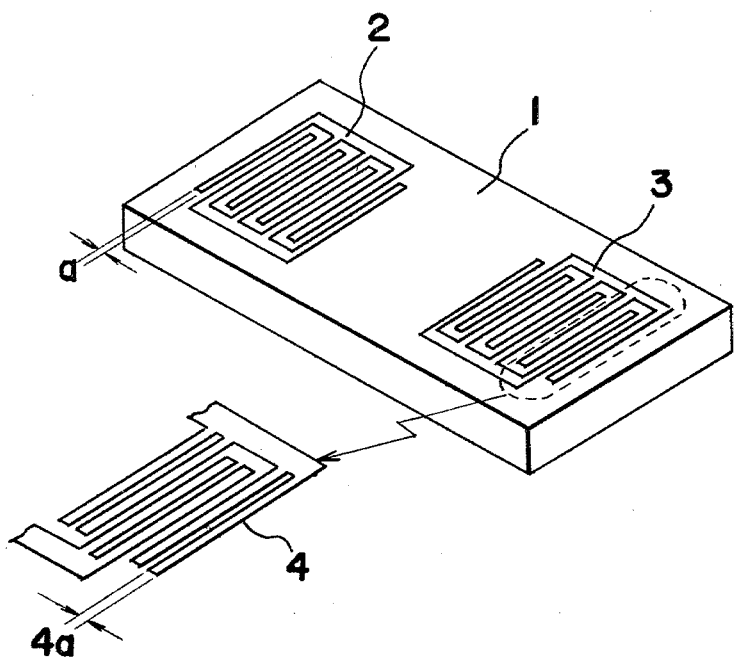
Figure 2:
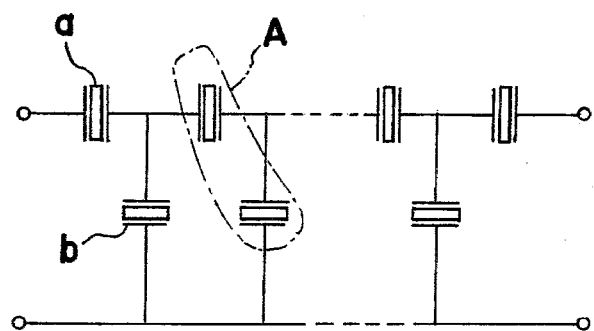
Figure 3:
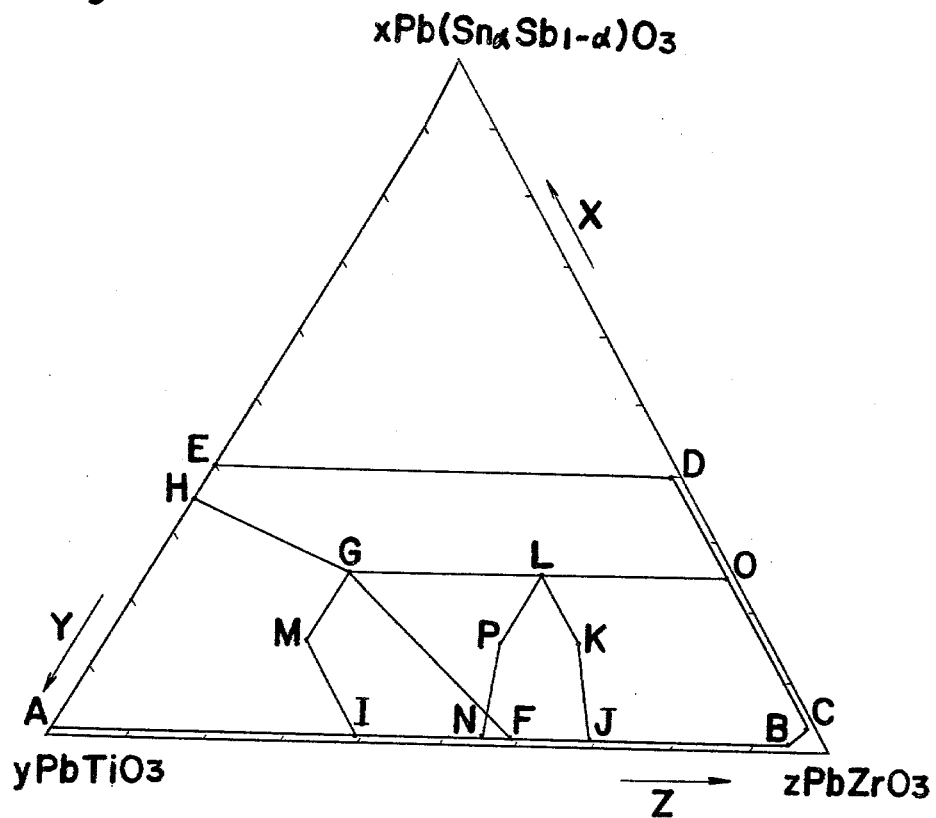
FIG. 3 is a triangular diagram showing the compositional area of main components of the piezoelectric ceramics according to the present invention.

What I claim is:

1. A method for producing a piezoelectric ceramic of a system $Pb(Sn_aSb_{1-a})O_3$-$PbTiO_3$-$PbZrO_3$, which comprises
   (a) preparing a mixture of raw materials selected from the group consisting of oxides and materials which produce oxides by calcination, to provide a piezoelectric ceramic composition expressed by the general formula $xPb(Sn_aSb_{1-a})O_3$-$yPbTiO_3$-$zPbZrO_3$ wherein subscrips a, x, y and z are mole fractions of the respective components and wherein $x+y+z=1.00$, $\frac{1}{4} \leq a \leq \frac{3}{4}$, said composition falling within a polygonal area defined by the points A, B, C, D and E in FIG. 3 (except the compositions defined by a line connecting the points A and E), the sets of mole fractions of the three components at said points being as follows:

|   | x | y | z |
|---|---|---|---|
| A | 0.01 | 0.99 | 0.00 |
| B | 0.01 | 0.04 | 0.95 |
| C | 0.04 | 0.01 | 0.95 |
| D | 0.40 | 0.01 | 0.59 |
| E | 0.40 | 0.60 | 0.00 |

(b) calcining said mixture and grinding the calcined body,
   (c) forming the resultant powder into forming bodies, and
   (d) sintering the forming bodies by firing them at a temperature of 1100° to 1350° C. in an oxygen atmosphere containing not less than 80 vol% of oxygen so as to produce an intermediate pyrochlore phase of $Pb_2Sn_{2a}Sb_{2-2a}O_{7-a}$ with oxygen defects at the grain boundaries of the forming bodies during the sintering process which promotes transfer of oxygen ions at said boundaries and effects the

TABLE 5

| Ex. No. | Sample No. | Oxygen conc. (%) | Density (g/cm³) | Vickers' hardness (kg/mm) | Deflective strength (kg/cm²) | Grain size (μ) | Average pore size (μ) |
|---|---|---|---|---|---|---|---|
|   | 19-1 | 100 | 7.89 (σ = 0.01) | 483 | 1490 | ≈3 | <1 |
|   | 19-2* | 20(air) | 7.78 (σ = 0.02) | 290 | 723 | ≈3 | 5 ~ 10 |
|   | 19-3* | hot-pressed | 7.90 (σ = 0.02) | 528 | 1518 | ≈2 | <1 |
| 2 | 31-1 | 95 | 7.86 (σ = 0.01) | 477 | 1355 | ≈3 | <2 |
|   | 31-2* | 30 | 7.75 (σ = 0.03) | 282 | 672 | ≈3 | 6 ~ 12 |
|   | 31-3* | hot-pressed | 7.87 (σ = 0.02) | 519 | 1437 | ≈1.5 | <1 |
|   | 25-1 | 100 | 7.84 (σ = 0.01) | 394 | 1098 | ≈4 | <2 |
|   | 25-2* | 40 | 7.73 (σ = 0.04) | 212 | 545 | ≈4 | 6 ~ 12 |
|   | 25-3* | hot-pressed | 7.85 (σ = 0.03) | 427 | 1184 | ≈2 | <1 |
|   | 27-1 | 80 | 7.85 (σ = 0.01) | 456 | 1153 | ≈2 | <1 |
| 3 | 27-2* | 20(air) | 7.73 (σ = 0.02) | 271 | 696 | ≈2 | 5 ~ 10 |
|   | 27-3* | hot-pressed | 7.86 (σ = 0.02) | 503 | 1311 | ≈1 | <1 |
|   | 34-1 | 90 | 7.85 (σ = 0.01) | 366 | 1058 | ≈3 | <1 |
|   | 34-2* | 20(air) | 7.75 (σ = 0.03) | 243 | 563 | ≈3 | 6 ~ 12 |
|   | 34-3* | hot-pressed | 7.85 (σ = 0.02) | 375 | 1197 | ≈2 | 1 |
|   | 18-1 | 100 | 7.90 (σ = 0.01) | 400 | 1125 | ≈3 | <2 |
|   | 18-2* | 20(air) | 7.79 (σ = 0.02) | 236 | 683 | ≈3 | 6 ~ 12 |
|   | 18-3* | hot-pressed | 7.92 (σ = 0.02) | 481 | 1342 | ≈1.5 | <1 |
| 4 | 28-1 | 100 | 7.86 (σ = 0.01) | 376 | 1077 | ≈5 | <2 |
|   | 28-2* | 30 | 7.77 (σ = 0.03) | 214 | 614 | ≈5 | 8 ~ 15 |
|   | 28-3* | hot-pressed | 7.89 (σ = 0.03) | 452 | 1157 | ≈3 | <1 |
|   | R-1* | 100 | 7.67 (σ = 0.02) | 135 | 395 | ≈12 | 8 ~ 15 |
| ref. | R-2* | 20(air) | 7.68 (σ = 0.03) | 146 | 406 | ≈12 | 8 ~ 15 |
|   | R-3* | hot-pressed | 7.83 (σ = 0.02) | 253 | 833 | ≈5 | <1 | production of a fine, dense ceramic; said pyrochlore phase being converted into a perovskite phase Pb(Sn$_a$Sb$_{1-a}$)O$_3$ at the end of the firing.

2. The method according to claim 1 wherein said composition falls within a polygonal area included in the polygonal area ABCDE and defined by points A, F, G and H in FIG. 3 (except the compositions defined by a line connecting the points A and H), the sets of mole fractions of the three components at said points being as follows:

|   | x | y | z |
|---|---|---|---|
| A | 0.01 | 0.99 | 0.00 |
| F | 0.01 | 0.40 | 0.59 |
| G | 0.25 | 0.50 | 0.25 |
| H | 0.35 | 0.65 | 0.00 |

3. The method according to claim 1 wherein said composition falls within a polygonal area included in the polygonal area ABCDE and defined by the points I, J, K, L, G and M, the sets of mole fractions of the three components at said points being as follows:

|   | x | y | z |
|---|---|---|---|
| I | 0.01 | 0.60 | 0.39 |
| J | 0.01 | 0.30 | 0.69 |
| K | 0.15 | 0.25 | 0.60 |
| L | 0.25 | 0.25 | 0.50 |
| G | 0.25 | 0.50 | 0.25 |
| M | 0.15 | 0.60 | 0.25 |

4. The method according to claim 1 wherein said composition falls within a polygonal area included in the polygonal area ABCDE and defined by the points N, B, C, O, L and P, the sets of mole fractions of the three components at said points being as follows:

|   | x | y | z |
|---|---|---|---|
| N | 0.01 | 0.44 | 0.55 |
| B | 0.01 | 0.04 | 0.95 |
| C | 0.04 | 0.01 | 0.95 |
| O | 0.25 | 0.01 | 0.74 |
| L | 0.25 | 0.25 | 0.50 |
| P | 0.15 | 0.35 | 0.50 |

5. The method according to claim 1 wherein said oxygen atmosphere contains not less than 95 vol% of oxygen.

6. The method according to claim 1 wherein a part of lead in the composition is replaced with not more than 20 atomic percent of at least one element selected from the group consisting of Ba, Ca, Sr and Cd.

7. The method according to claim 1 wherein said forming bodies are formed from fine particle constituents having average grain size of not more than 4 microns.

8. The method according to claim 1 wherein said composition further contains manganese in the oxide form and its content is 0.5 to 5.0 wt% when converted into MnO$_2$.

9. The method according to claim 1 wherein said composition further contains magnesium in the oxide form and its content is 0.5 to 5.0 wt% when converted into MgO.

10. The method according to claim 1 wherein said composition further contains chromium in the oxide form and its content is 0.5 to 5.0 wt% when converted into Cr$_2$O$_3$.

11. The method according to claim 8 wherein said composition further contains magnesium in the oxide form and its content is 0.5 to 5.0 wt% when converted into MgO.

12. The method according to claim 8 or 9 wherein said composition further contains chromium in the oxide form and its content is 0.5 to 5.0 wt% when converted into Cr$_2$O$_3$.

13. The method according to claim 8, wherein said composition further contains magnesium and chromium in the oxide forms, wherein the content of magnesium is 0.5 to 5.0 weight percent when converted into MgO and the content of chromium is 0.5 to 5.0 weight percent when converted into Cr$_2$O$_3$.

* * * * *